(12) United States Patent
Yamamoto

(10) Patent No.: US 7,763,141 B2
(45) Date of Patent: Jul. 27, 2010

(54) METHOD FOR JOINING ADHESIVE TAPE TO SEMICONDUCTOR WAFER, METHOD FOR SEPARATING PROTECTIVE TAPE FROM SEMICONDUCTOR WAFER, AND APPARATUSES USING THE METHODS

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 406 days.

(21) Appl. No.: 11/819,827

(22) Filed: Jun. 29, 2007

(65) Prior Publication Data
US 2008/0023133 A1   Jan. 31, 2008

(30) Foreign Application Priority Data
Jul. 31, 2006  (JP) .............................. 2006-208118

(51) Int. Cl.
*B29C 63/00* (2006.01)
(52) U.S. Cl. ...................... 156/285; 156/156; 156/344
(58) Field of Classification Search ................ 156/285, 156/344, 156
See application file for complete search history.

(56) References Cited

U.S. PATENT DOCUMENTS 5,171,398 A    12/1992   Miyamoto
5,961,768 A    10/1999   Tsujimoto
2006/0068524 A1 *  3/2006   Yamamoto .................. 438/118
2006/0219359 A1 * 10/2006   Miyamoto et al. .......... 156/344

FOREIGN PATENT DOCUMENTS

DE    197 33 339 A1    2/1998
JP        63-166243 A   7/1988
JP       2002-124494    4/2002

OTHER PUBLICATIONS

The Extended European Search Report for the Application No. EP 07 01 2033 dated Aug. 13, 2009.

* cited by examiner

*Primary Examiner*—Khanh Nguyen
*Assistant Examiner*—John Blades
(74) *Attorney, Agent, or Firm*—Cheng Law Group, PLLC

(57) ABSTRACT

An annular convex portion is formed along an outer periphery of a back face of a wafer so as to surround a ground area in the back face. The annular convex portion is suction held by a holding table while being brought into close contact with the holding table, and fluid is supplied into a space defined between the back face of the wafer and the holding table. In this state, a separating adhesive tape is supplied toward a surface of a protective tape, and then a joining roller moves from a first end to a second end of the wafer while pressing the adhesive tape against the wafer. Then, a guide member moves from the first end to the second end of the wafer to guide the adhesive tape joined to the protective tape in a reverse direction.

14 Claims, 15 Drawing Sheets

METHOD FOR JOINING ADHESIVE TAPE TO SEMICONDUCTOR WAFER, METHOD FOR SEPARATING PROTECTIVE TAPE FROM SEMICONDUCTOR WAFER, AND APPARATUSES USING THE METHODS

BACKGROUND OF THE INVENTION (1) Field of the Invention

The present invention relates to a method for joining a separating adhesive tape to a protective tape joined to a front face (a face on which a pattern is formed) of a semiconductor wafer (hereinafter, simply referred to as "wafer"), a method for separating the protective tape from the front face of the wafer by means of the separating adhesive tape, and apparatuses using the methods.

(2) Description of the Related Art

After completion of a pattern forming process, a semiconductor wafer is subjected to a back grinding process in a state that a protective tape is joined to a front face of the semiconductor wafer in order to protect a pattern. Thereafter, the protective tape is separated from the front face of the wafer, and then the wafer is subjected to a dicing process in which the wafer is divided into chips.

JP-A 2002-124494 discloses one example of a technique for separating a protective tape from a front face of a wafer. According to this technique, a wafer is held by a table in a state that a front face, to which a protective tape is joined, of the wafer is directed upward. Then, a separating adhesive tape is joined to the protective tape while being separated in a reverse direction. Thus, the protective tape joined to and integrated with the adhesive tape is separated from the front face of the wafer.

Recently, a wafer is made thinner in response to needs for size reduction and high-density package as to an electronic device. However, a wafer made thin so as to have a thickness of several tens of micrometers becomes cracked or chipped readily due to occurrence of warpage. Consequently, there is a high possibility that such wafer is damaged in various processing steps and handling. In order to avoid such disadvantage, there is the following proposition. That is, a center of a wafer is ground in a back grinding process to form an annular convex portion at an outer periphery of a back face of the wafer; thus, the wafer is allowed to have rigidity. That is, the wafer is processed so as to be less susceptible to damage in handling.

The annular convex portion left on the wafer brings rigidity capable of withstanding warpage. Therefore, such wafer facilitates handling without being damaged. If the wafer is held by the table in a state that a back face thereof is directed downward, however, the annular convex portion comes into contact with the table, but a flat concave portion corresponding to the center of the back face of the wafer does not come into contact with the table. Consequently, there is a problem that it is impossible to join a separating adhesive tape to a wafer, which has been made thin, with good accuracy and to separate the separating adhesive tape together with a protective tape from the wafer with good accuracy.

SUMMARY OF THE INVENTION

The present invention is devised in view of the aforementioned circumstances. An object of the present invention is to provide a method for joining a separating adhesive tape to a semiconductor wafer and a method for separating a protective tape from the semiconductor wafer, each producing the following effect: it is possible to perform joining of the separating adhesive tape and separation of the protective tape using the separating adhesive tape with good accuracy without damage of the semiconductor wafer even when the semiconductor wafer has been made thin.

In order to accomplish the aforementioned object, the present invention adopts the following configuration:

A method for joining a separating adhesive tape to a protective tape joined to a front face of a semiconductor wafer, the method comprising the steps of allowing a holding table to suction hold an annular convex portion, which is formed along an outer periphery of a back face of the semiconductor wafer so as to surround a back-ground area, such that the holding table is brought into close contact with the entire annular convex portion; supplying fluid from a side of the holding table into a space defined between the back face of the semiconductor wafer and the holding table, for increasing an internal pressure in the space; supplying the separating adhesive tape toward a surface of the protective tape joined to the semiconductor wafer; and allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape.

In this method according to the present invention, a semiconductor wafer is subjected to back grinding so as to have a thickness of several tens of micrometers. Such semiconductor wafer is reinforced with an annular convex portion formed at an outer periphery of a back face thereof. Accordingly, it is possible to prevent the semiconductor wafer from being disadvantageously bent or warped in handling or another processing.

In a case that a separating adhesive tape is to be joined to a protective tape joined to a front face of the semiconductor wafer, fluid is supplied into a space defined inside the semiconductor wafer, so that a pressure in the space is appropriately increased. The joining member presses the adhesive tape against the protective tape in the aforementioned state. Therefore, a joining force is prevented from being weakened due to disadvantageous deformation of the semiconductor wafer by the joining force. As a result, the adhesive tape can be joined to the protective tape with certainty.

Herein, the width of the joining member is larger than an outer diameter of the semiconductor wafer. Therefore, a position pressed by the joining member is restricted by the annular convex portion formed along the outer periphery of the back face of the wafer placed on the holding table. That is, even when the joining member presses a thin portion of the wafer, which does not come into contact with the holding table, the wafer is prevented from being largely deformed so as to swell downward.

In this method, the holding table may include a recess communicated with a flat concave portion formed on the back face of the semiconductor wafer by grinding, and the annular convex portion of the semiconductor wafer may be suction held by an outer periphery of the recess.

With this configuration, a space of a large volume is defined between the back face of the semiconductor wafer and the holding table in such a manner that the flat concave portion of the semiconductor wafer and the recess of the holding table are communicated with each other. As the volume of the space is larger, a fluctuation of an internal pressure with respect to an mount of air to be supplied into the space is smaller. This leads to facilitation of control for maintaining the internal pressure at a predetermined value.

In this method, preferably, the fluid is supplied into the space while an outflow of the fluid from the space is permitted, so that a pressure in the space is increased.

With this configuration, when the internal pressure in the space defined between the back face of the semiconductor wafer and the holding table is increased, the semiconductor wafer is deformed so as to slightly swell upward. That is, when the joining member is pressed against the semiconductor wafer from above, the semiconductor wafer is flattened. When the semiconductor wafer is flattened and then the space is reduced in volume as compared with the time when the semiconductor wafer swells upward, the internal air is discharged from the space, so that an increase in inner pressure is suppressed.

Herein, the outflow of the fluid from the space is performed through, for example, a fine hole or a relief valve attached to a discharge hole communicated with the holding table to adjust an operating pressure.

In this method, preferably, the joining member moves slowly at a adhesive tape joining start position. Also preferably, a pressing force of the joining member to be applied to the annular convex portion corresponding to the adhesive tape joining start position is larger than a pressing force of the joining member to be applied to the flat concave portion formed inside the annular convex portion. With this configuration, the adhesive tape can be brought into close contact with the protective tape.

In order to accomplish the aforementioned object, the present invention also adopts the following configuration:

A method for separating from a semiconductor wafer a protective tape joined to a front face of the semiconductor wafer, the method comprising the steps of: allowing a holding table to suction hold an annular convex portion, which is formed along an outer periphery of a back face of the semiconductor wafer so as to surround a back-ground area, such that the holding table is brought into close contact with the entire annular convex portion; supplying fluid from a side of the holding table into a space defined between the back face of the semiconductor wafer and the holding table, for increasing an internal pressure in the space; supplying a separating adhesive tape toward a surface of the protective tape joined to the semiconductor wafer; allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape; and allowing a guide member, which moves from the first end to the second end of the semiconductor wafer, to guide the joined separating adhesive tape in a reverse direction, for separating the protective tape integrated with the adhesive tape from the front face of the semiconductor wafer.

In this method according to the present invention, a semiconductor wafer is subjected to back grinding so as to have a thickness of several tens of micrometers. Such semiconductor wafer is reinforced with an annular convex portion formed at an outer periphery of a back face thereof. Accordingly, it is possible to prevent the semiconductor wafer from being disadvantageously bent or warped in handling or another processing.

In a case that a separating adhesive tape is to be joined to a protective tape joined to a front face of the semiconductor wafer, fluid is supplied into a space defined inside the semiconductor wafer, so that a pressure in the space is appropriately increased. The joining member presses the adhesive tape against the protective tape in the aforementioned state. Therefore, a joining force is prevented from being weakened due to disadvantageous deformation of the semiconductor wafer by the joining force. As a result, the adhesive tape can be joined to the protective tape with certainty.

Herein, the width of the joining member is larger than an outer diameter of the semiconductor wafer. Therefore, a position pressed by the joining member is restricted by the annular convex portion formed along the outer periphery of the back face of the wafer placed on the holding table. That is, even when the joining member presses a thin portion of the wafer, which does not come into contact with the holding table, the wafer is prevented from being largely deformed so as to swell downward.

Further, the guide member guides the joined adhesive tape in the reverse direction; thus, the protective tape integrated with the adhesive tape is separated from the front face of the wafer. Also in this case, the semiconductor wafer is reinforced with the annular convex portion formed along the outer periphery of the back face thereof. Therefore, the semiconductor wafer is prevented from being damaged due to adhesion of the protective tape.

In this method, preferably, the guide member is used as the joining member so that the joining of the adhesive tape to the protective tape and the separation of the protective tape from the semiconductor wafer are performed simultaneously.

With this configuration, the guide member joins the adhesive tape to the surface of the protective tape while pressing the adhesive tape against the surface of the protective tape and, simultaneously, guides the adhesive tape in the reverse direction to thereby separate the protective tape integrated with the adhesive tape from the front face of the semiconductor wafer. Thus, the joining of the adhesive tape to the protective tape and the separation of the protective tape from the semiconductor wafer can be performed simultaneously. This leads to reduction in processing time and simplification in configuration of an apparatus unlike a case that joining of a adhesive tape using a joining member and separation of the adhesive tape using a guide member are performed independently.

For example, the guide member to be used herein is made of a plate material having an edge. In this case, the adhesive tape integrated with the protective tape is folded back at a steep angle by the edge of the guide member. Therefore, an angle that the tape is separated from the semiconductor wafer is considerably larger than an angle in a case that a roller guides the tape in a reverse direction. Thus, an orthogonal component acted on the front face of the semiconductor wafer by a separating force generated at a separation point between the front face of the semiconductor wafer and the protective tape becomes small. As a result, even when the adhesion of the protective tape is not sufficiently lowered, the protective tape can be readily and smoothly separated from the semiconductor wafer without a large separating force to be applied to the semiconductor wafer.

In order to accomplish the aforementioned object, the present invention also adopts the following configuration:

An apparatus for joining a separating adhesive tape to a protective tape joined to a front face of a semiconductor wafer having a back face on which an annular convex portion is formed along an outer periphery so as to surround a back-ground area and a flat concave portion is formed at an inner-diameter side of the annular convex portion, the apparatus comprising: a holding table for suction holding the annular convex portion of the back face of the semiconductor wafer; fluid supply means for supplying fluid from a side of the holding table into a space defined between the back face of the semiconductor wafer and the holding table; tape supply means for supplying the separating adhesive tape toward a surface of the protective tape joined to the semiconductor wafer; and a tape joining unit allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape.

With this configuration, it is possible to suitably realize the aforementioned adhesive tape joining method.

In order to accomplish the aforementioned object, the present invention also adopts the following configuration:

An apparatus for separating from a semiconductor wafer a protective tape joined to a front face of the semiconductor wafer having a back face on which an annular convex portion is formed along an outer periphery so as to surround a background area and a flat concave portion is formed at an inner-diameter side of the annular convex portion, the apparatus comprising: a holding table for suction holding the annular convex portion of the back face of the semiconductor wafer; fluid supply means for supplying fluid from a side of the holding table into a space defined between the back face of the semiconductor wafer and the holding table; tape supply means for supplying a separating adhesive tape toward a surface of the protective tape joined to the semiconductor wafer; a tape joining unit allowing a joining member, which has a width larger than an outer diameter of the semiconductor wafer, to move from a first end to a second end of the semiconductor wafer such that the joining member presses a non-adhesive surface of the adhesive tape against the surface of the protective tape, for joining the adhesive tape to the surface of the protective tape; and separation means allowing a guide member, which moves from the first end to the second end of the semiconductor wafer, to guide the joined separating adhesive tape in a reverse direction, for separating the protective tape integrated with the adhesive tape from the front face of the semiconductor wafer.

With this configuration, it is possible to suitably realize the aforementioned protective tape separating method.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

With reference to FIGS. 1 to 16, hereinafter, description will be given of an apparatus according to a first embodiment of the present invention, that is, an apparatus capable of realizing a method for joining a adhesive tape to a semiconductor wafer and a method for separating a protective tape from the semiconductor wafer.

Figure 1:
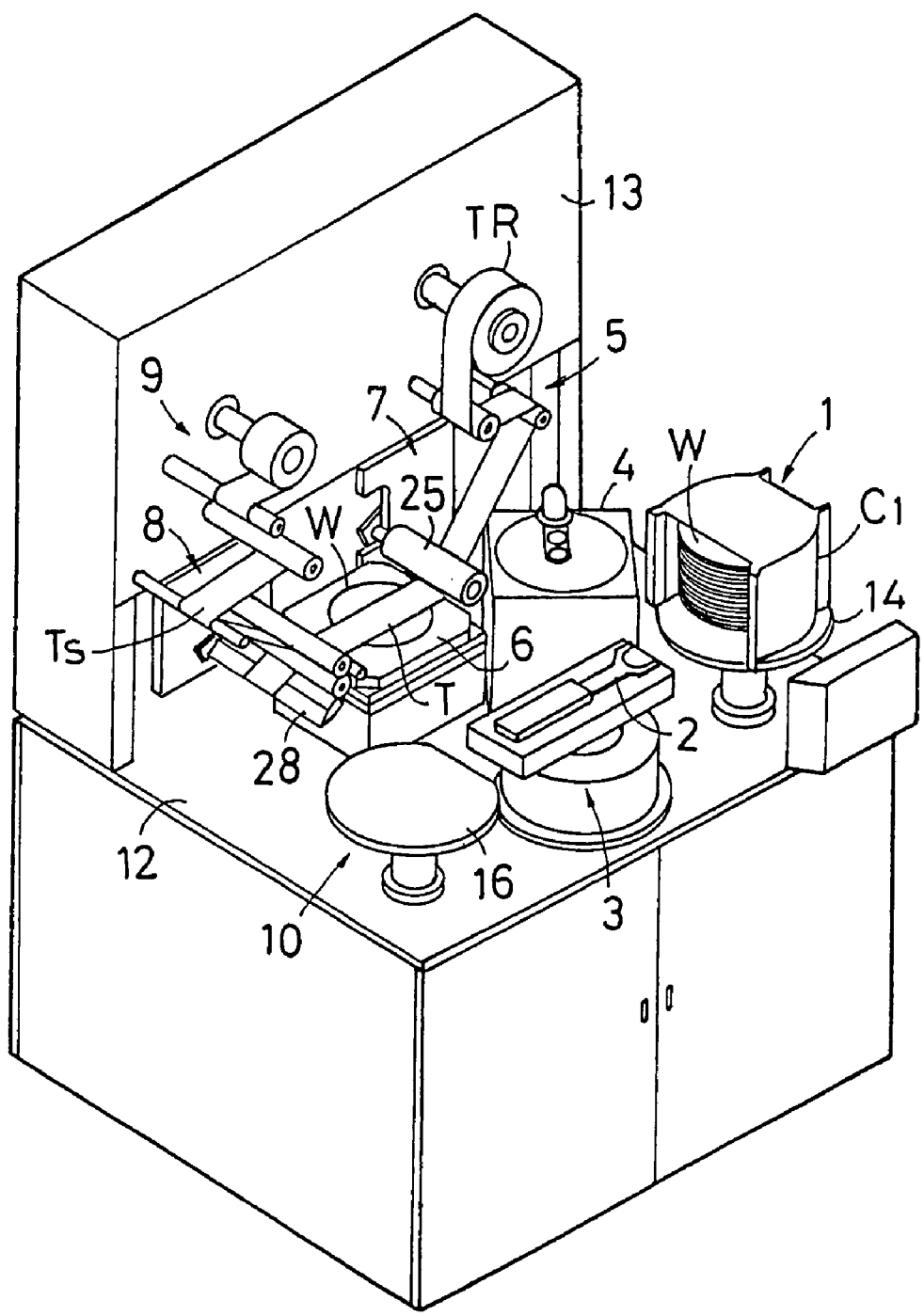
FIG. 1 is a perspective view illustrating a general configuration of a protective tape separation apparatus according to a first embodiment of the present invention.
Figure 2:
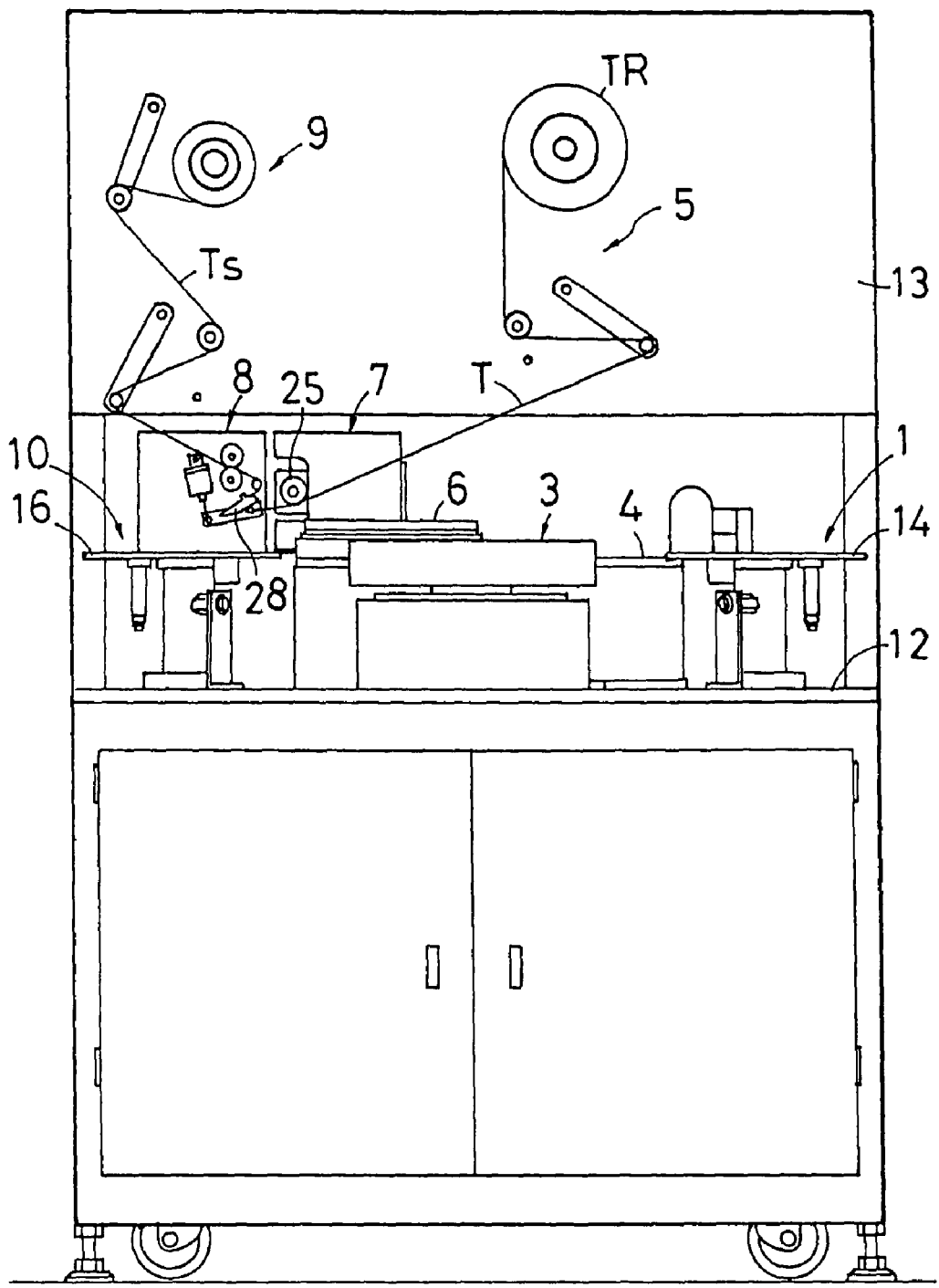
FIG. 2 is a front view illustrating the general configuration of the protective tape separation apparatus according to the first embodiment.
Figure 3:
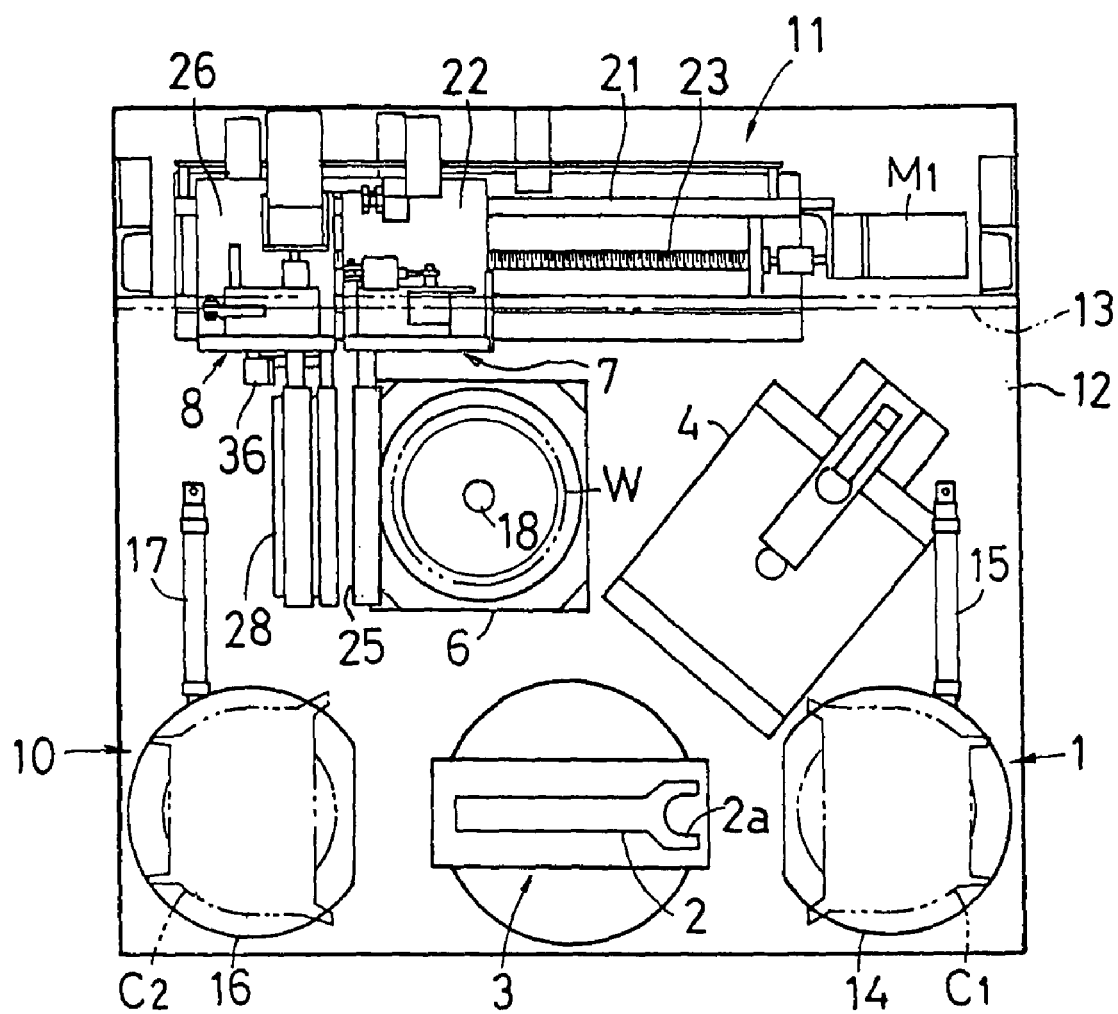
FIG. 3 is a plan view illustrating the general configuration of the protective tape separation apparatus according to the first embodiment.

FIG. 1 is a perspective view illustrating a general configuration of an apparatus for separating a protective tape from a semiconductor wafer as one example of the apparatus executing the method according to the present invention. FIG. 2 is a front view illustrating the general configuration of the apparatus. FIG. 3 is a plan view illustrating the general configuration of the apparatus.

In the adhesive tape joining/separation apparatus, a wafer supply section 1, a wafer transport mechanism 3, an alignment stage 4, a tape supply section 5, a holding table 6, a tape joining unit 7, a tape separation unit 8, a tape collection section 9, a wafer collection section 10, a unit driving section 11 and the like are provided on a base 12. The wafer supply section 1 includes a cassette C1 for housing wafers W, each of which has been subjected to a back grinding process, in a stacked manner. The wafer transport mechanism 3 is equipped with a robot arm 2. The alignment stage 4 performs alignment on the wafer W. The tape supply section 5 supplies a separating adhesive tape T toward a site where a separating process is performed. The holding table 6 suction holds the wafer W. The tape joining unit 7 joins the adhesive tape T to the wafer W on the holding table 6. The tape separation unit 8 separates the joined adhesive tape T. The tape collection section 9 reels and collects the adhesive tape Ts subjected to the separating process. The wafer collection section 10 includes a cassette C2 for housing the wafers W, each of which has been subjected to the separating process, in a stacked manner. The unit driving section 11 allows the tape joining unit 7 and the tape separation unit 8 to independently reciprocate laterally.

Herein, the wafer supply section 1, the wafer transport mechanism 3, the alignment stage 4, the holding table 6 and the wafer collection section 10 are disposed at a top side of the base 12. The tape supply section 5 and the tape collection section 9 are disposed at a front side of a vertical wall 13 which is provided upright on the top side of the base 12. The tape joining unit 7 and the tape separation unit 8 are directed to an opening formed below the vertical wall 13. The unit driving section 11 is disposed at a rear side of the vertical wall 13.

In the wafer supply section 1, wafers W in a horizontal posture are inserted into and housed in the cassette C1 with an appropriate clearance vertically interposed therebetween in a state that a front face of each wafer W, to which an ultraviolet-ray curable protective tape PT is joined, is directed upward. The cassette C1 is mounted on a cassette bench 14 with the wafers W inserted thereinto and housed therein. As illustrated in FIG. 3, the cassette bench 14 is turnable by an air cylinder 15 such that a direction thereof is changed.

In the wafer collection section 10, similarly, wafers W in a horizontal posture are inserted into and housed in the cassette C2 with an appropriate clearance vertically interposed therebetween in a state that a protective tape PT is separated from each wafer W, and the cassette C2 is mounted on a cassette bench 16 with the wafers W inserted thereinto and housed therein. The cassette bench 16 is also turnable by an air cylinder 17 such that a direction thereof is changed. Herein, the wafer W is irradiated with ultraviolet rays before being housed in the cassette C1 such that a adhesive surface of the protective tape PT is lowered in adhesion.

Figure 7:
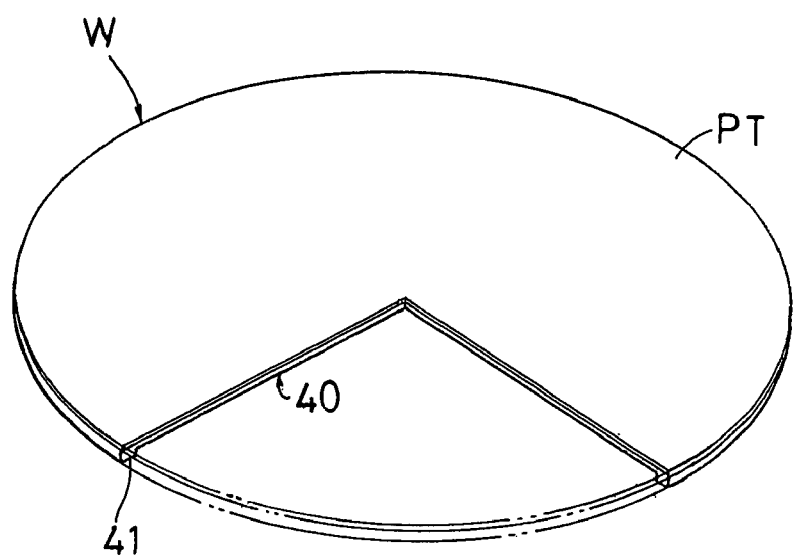
FIG. 7 is a partially-cutout perspective view illustrating a front face of a semiconductor wafer.
Figure 8:
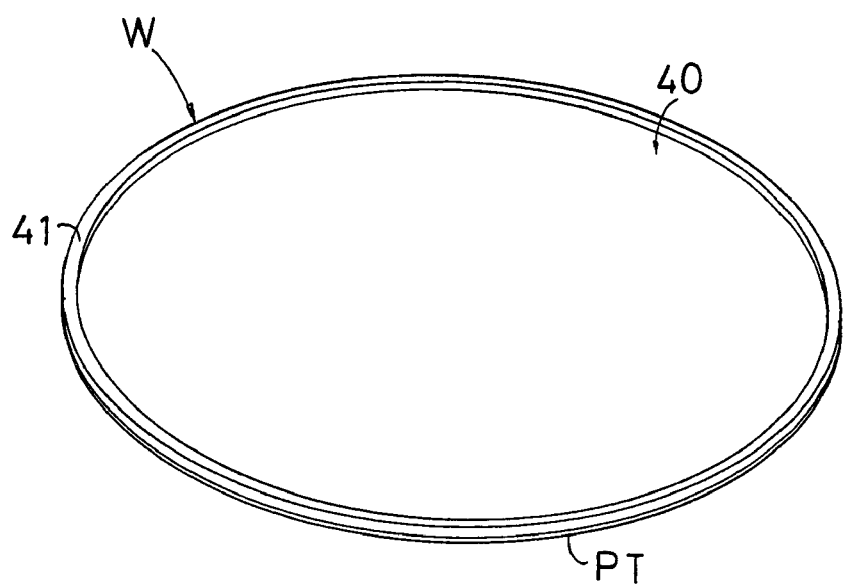
FIG. 8 is a perspective view illustrating a back face of the semiconductor wafer.
Figure 9:
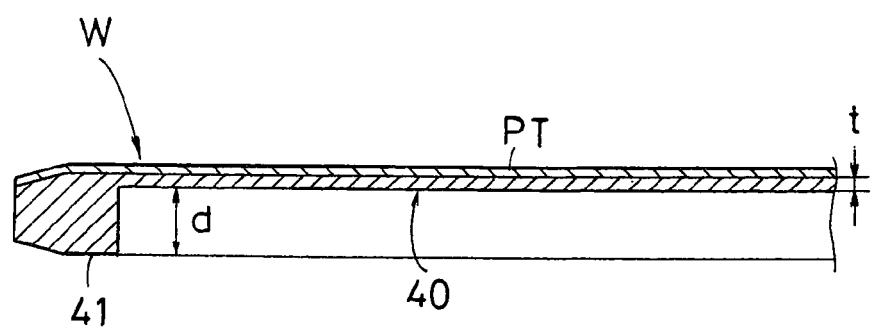
FIG. 9 is a partially-enlarged vertical sectional view illustrating the semiconductor wafer.

As illustrated in FIGS. 7 to 9, a wafer W which is a subject to be processed is subjected to a back grinding process in a state that a protective tape PT is joined to a front face (a face on which a pattern is formed) thereof. A back face of the wafer W is ground such that an outer periphery is higher than a ground area by about 2 mm in a radial direction. More specifically, a flat concave portion 40 is formed on the back face and an annular convex portion 41 is left along the outer periphery of the back face.

Herein, the flat concave portion 40 has a depth d of several hundreds of micrometers and a thickness t of several tens of micrometers, for example. That is, the annular convex portion 41 formed at the outer periphery of the back face functions as an annular rib for enhancing rigidity of the wafer W. Accordingly, the annular convex portion 41 hinders the wafer W from being bent or warped in handling or another processing.

As illustrated in FIG. 3, the robot arm 2 of the transport mechanism 3 is advanceable/retreatable horizontally, is turnable and is movable vertically. The robot arm 2 has a tip end provided with a suction holding part 2a formed into a horseshoe shape. The robot arm 2 takes a wafer W out of the wafer supply section 1, supplies the wafer W to the alignment stage 4, transports the wafer W from the alignment stage 4 to the holding table 6, carries the processed wafer W out of the holding table 6, and carries the processed wafer W in the wafer collection section 10.

The tape supply section 5 guides a separating adhesive tape T, which is unreeled from an original tape roll TR, toward the tape joining unit 7 and the tape separation unit 8 via a position above the holding table 6. A width of the adhesive tape T to be used herein is smaller than a diameter of a wafer W. It is to be noted that the tape supply section 5 corresponds to tape supply means according to the present invention.

Figure 10:
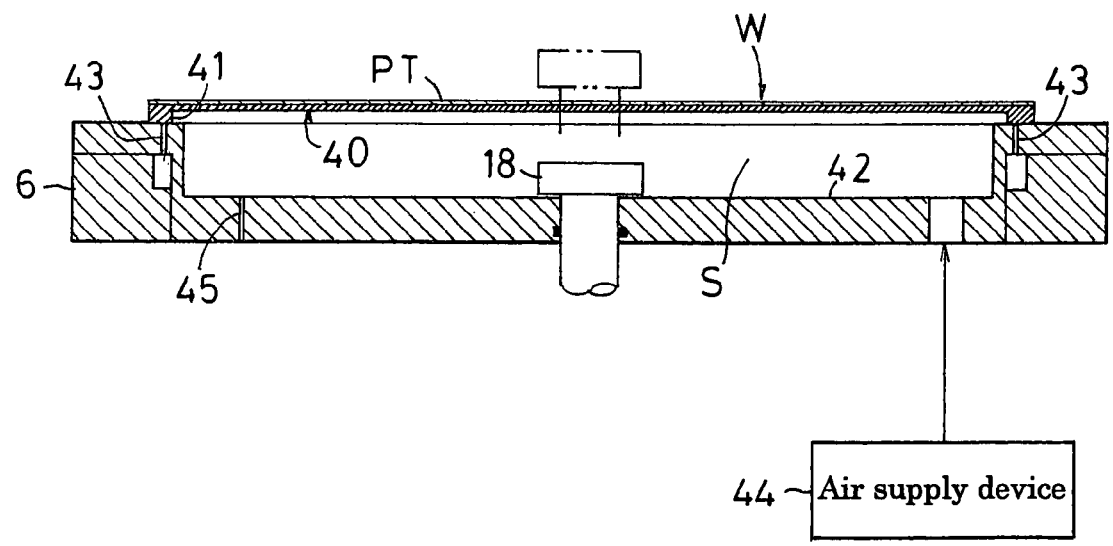
FIG. 10 is a vertical sectional view illustrating a state that a wafer is placed on a holding table.

As illustrated in FIG. 10, a circular recess 42 is formed on the holding table 6 which holds a wafer W placed thereon in separation of a protective PT. The recess 42 is almost equal in diameter to a ground area in a back face of the wafer W. Further, vacuum suction holes 43 are arranged in a ring shape along an outer periphery of the recess 42. Each vacuum suction hole 43 acts on an annular convex portion 41 of the wafer W. Moreover, the recess 42 is provided with a fine hole 45 which is communicated with and connected to an air supply device 44 and permits internal air with appropriate resistance to flow externally. In addition, a suction pad 18 for giving or receiving the wafer W is provided at a center of the recess 42 so as to protrude from or retreat into the recess 42. It is to be noted that the air supply device 44 corresponds to fluid supply means according to the present invention.

Figure 4:
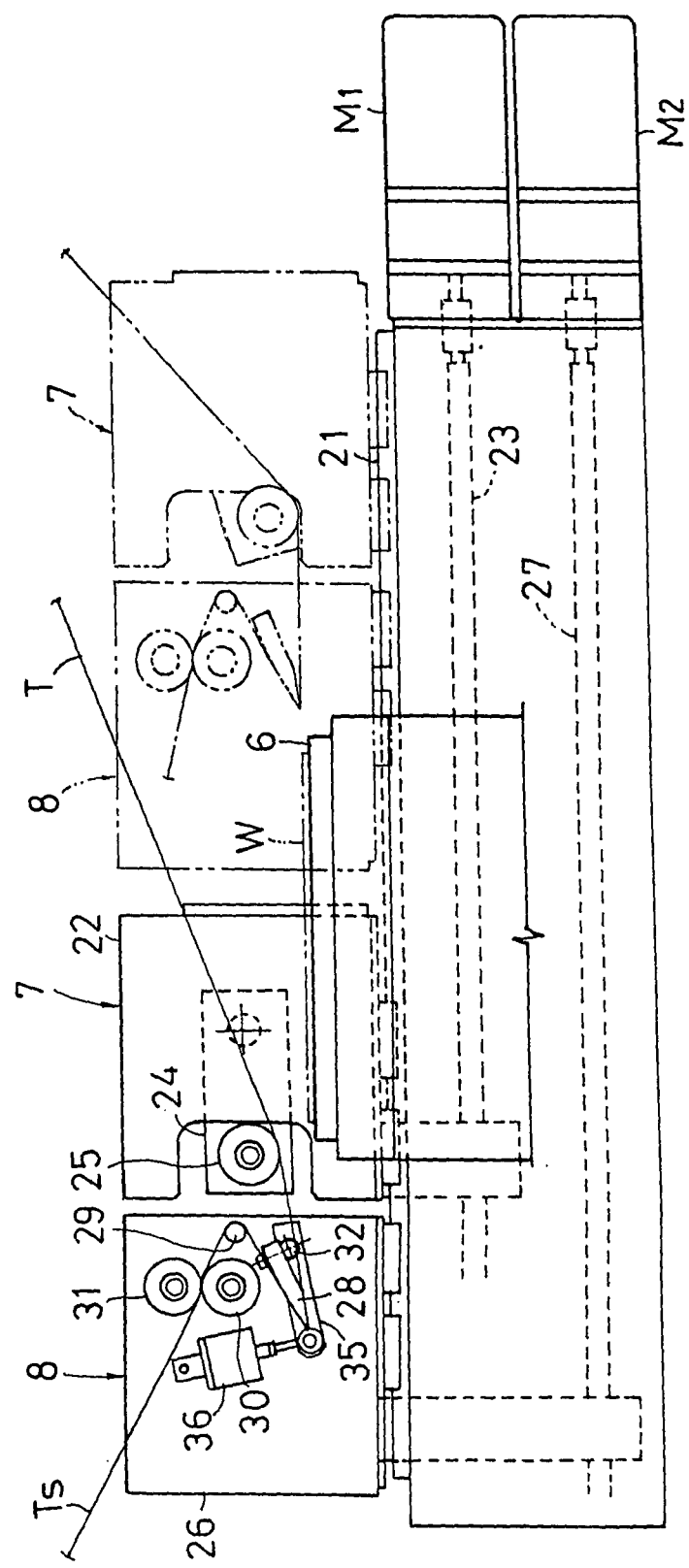
FIG. 4 is a front view illustrating a tape joining unit and a tape separation unit.

As illustrated in FIG. 4, the tape joining unit 7 has the following structure. That is, a movable bench 22 is supported on a rail 21 so as to move laterally along the rail 21, and is allowed to reciprocate laterally and horizontally at a fixed stroke through a feed screw 23 which is driven by a motor M1 in a forward/backward direction. Further, the movable bench 22 is equipped with a joining roller 25 which is movable vertically through a rocking arm 24. A width of the joining roller 25 to be used herein is larger than an outer diameter of a wafer W. It is to be noted that the joining roller 25 corresponds to a joining member according to the present invention.

On the other hand, the tape separation unit 8 has the following structure. That is, a movable bench 26 is supported on the rail 21 so as to move laterally along the rail 21, and is allowed to reciprocate laterally and horizontally at a fixed stroke through a feed screw 27 which is driven by a motor M2 in a forward/backward direction. The movable bench 26 is equipped with a tape separating guide member 28, a guide roller 29, a feed roller 30 which is rotatably driven, and a nip roller 31 which is opposite to the feed roller 30. It is to be noted that the tape separation unit 8 corresponds to separation means according to the present invention.

Figure 5:
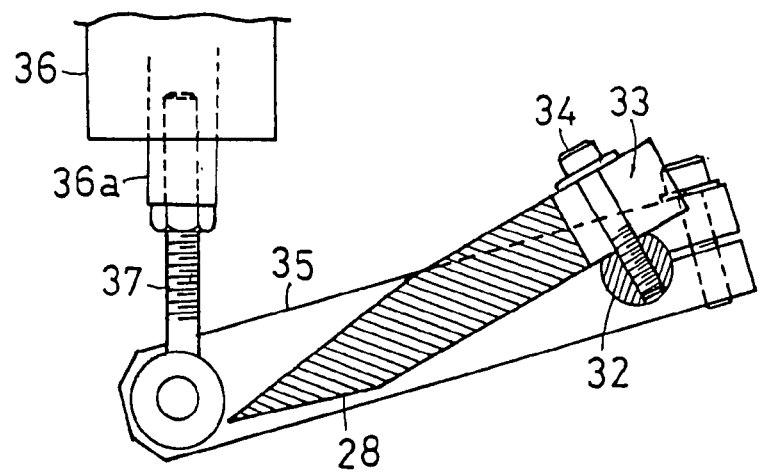
FIG. 5 is a front view illustrating a support structure of a tape separating edge member.
Figure 6:
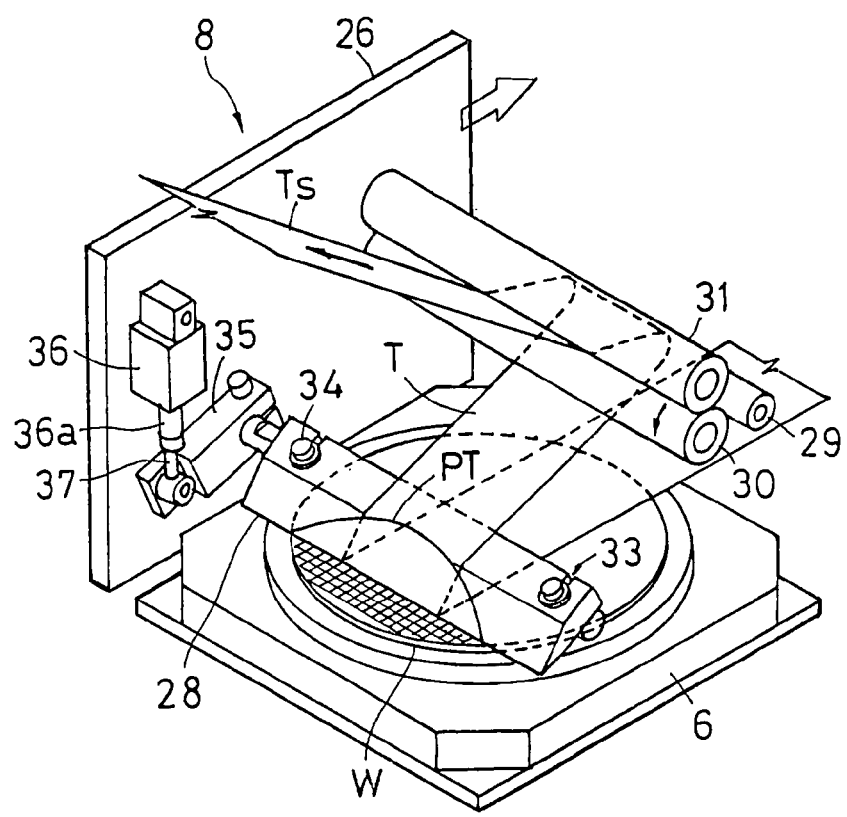
FIG. 6 is a perspective view illustrating statuses of main components upon performance of a tape separating operation.

As illustrated in FIGS. 5 and 6, the tape separating guide member 28 is formed into a plate shape. Herein, a tip end of the guide member 28 is formed into a sharp edge, and a width of the guide member 28 is larger than an outer diameter of a wafer W. Moreover, the guide member 28 is fixedly coupled to a rotational support shaft 32 through a slit 33 and a bolt 34 such that advancement or retreat of the guide member 28 is adjustable. The rotational support shaft 32 is rotatably supported at the front side of the movable bench 26. Moreover, an operating arm 35 is fastened to and coupled to a base end of the rotational support shaft 32. Further, a coupling rod 37 is pivotally supported on and coupled to a free end of the operating arm 35, and is coupled to an air cylinder 36 which is attached to the front side of the movable bench 26. The rotational support shaft 32 is rotated by rocking of the operating arm 35 caused by advancement or retreat of the air cylinder 36. With this operation, the tip end edge of the guide member 28 moves upward/downward.

In addition, a coupling rod 37 is extended from the free end of the operating arm 35, and is screwed into and attached to a piston rod 36a of the air cylinder 36. By adjustment of a screwed amount of the coupling rod 37, it is possible to adjust a rocking angle of the operating arm 35 when the piston rod 36a protrudes to its stroke end. In other words, it is possible to optionally adjust an angle of the edge member 28 located at a lower limit position.

The respective components of the adhesive tape joining/separation apparatus according to the present invention are configured as described above. With reference to FIGS. 10 to 15, next, description will be given of basic steps of joining a separating adhesive tape T to a protective tape PT joined to a front face of a wafer W; and separating the protective tape PT from the front face of the wafer W.

First, the robot arm 2 is inserted into the cassette C1 of the wafer supply section 1, suction holds a back face of a predetermined wafer W, takes the wafer W out of the cassette C1, and transfers the wafer W to the alignment stage 4. The alignment stage 4 performs alignment on the wafer W on the basis of detection of a detection site such as a notch previously formed at an outer periphery of the wafer W. After completion of the alignment, the robot arm 2 suction holds the back face of the wafer W again, and transports the wafer W to the holding table 6 which moves downward to a wafer reception level on standby.

As illustrated in FIG. 10, when the wafer W is transported to the holding table 6, the suction pad 18 protrudes from the holding table 6 to receive the wafer W. Then, the suction pad 18 moves downward, so that the wafer W is placed on the holding table 6 in a predetermined posture and at a predetermined position. Herein, the vacuum suction holes 43 formed along the outer periphery of the recess 42 suction hold an annular convex portion 41 formed along an outer periphery of the back face of the wafer W. In addition, when the wafer W is suction held on the holding table 6, the air supply device 44 supplies air into the recess 42. Thus, a space S defined between the wafer W and the holding table 6 is applied with a predetermined pressure which is slightly higher than an atmospheric pressure.

Figure 11:
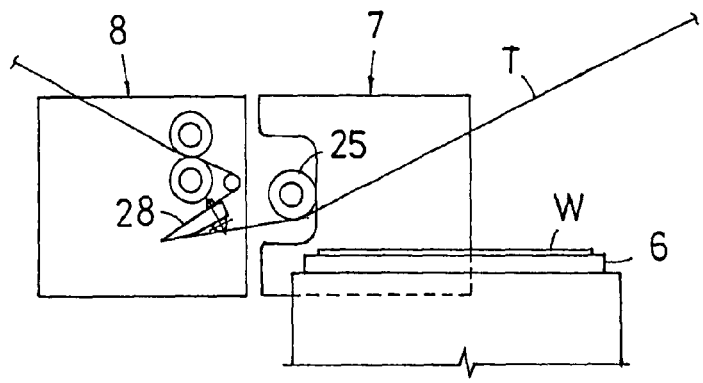
FIGS. 11 to 15 are front views each illustrating a tape separating step in the first embodiment.

As illustrated in FIG. 11, at a point in time when the wafer W is transported to the holding table 6, the tape joining unit 7 and the tape separation unit 8 are situated at standby positions, respectively, which are spaced away from the holding table 6 in a rearward direction.

Figure 12:
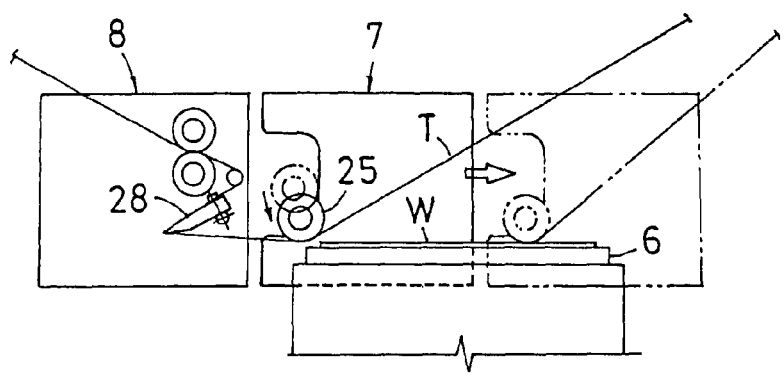

As illustrated in FIG. 12, when the wafer W is transported to the holding table 6, the joining roller 25 of the tape joining unit 7 moves downward to a predetermined joining level. Thereafter, the tape joining unit 7 moves forward as a whole, and the joining roller 25 rolls on the front face of the wafer W. As a result, a adhesive tape T is joined to a surface of a protective tape PT.

Herein, the wafer W is deformed by an internal pressure in the recess 42 so as to swell upward. However, the wafer W is flattened by being pressed by the joining roller 25 from above, so that the adhesive tape T is joined to the surface of the protective tape PT with certainty by reception of a counterforce of the press.

The width of the joining roller 25 to be used herein is larger than an outer diameter of the wafer W. Therefore, a force that the joining roller 25 presses the wafer W placed on the holding table 6 is restricted by the annular convex portion 41 formed along the outer periphery of the back face of the wafer W. Accordingly, the thin portion of the wafer W pressed from above is prevented from being deformed by the joining roller 25 so as to swell downward.

When the thin portion of the wafer W is flattened by the joining roller 25, the space S is reduced in volume as compared with the time when the wafer W swells upward; thus, the inner pressure in the space S is increased. Herein, the air in the space S flows out through the fine hole 45, so that the increase in internal air is suppressed.

Figure 13:
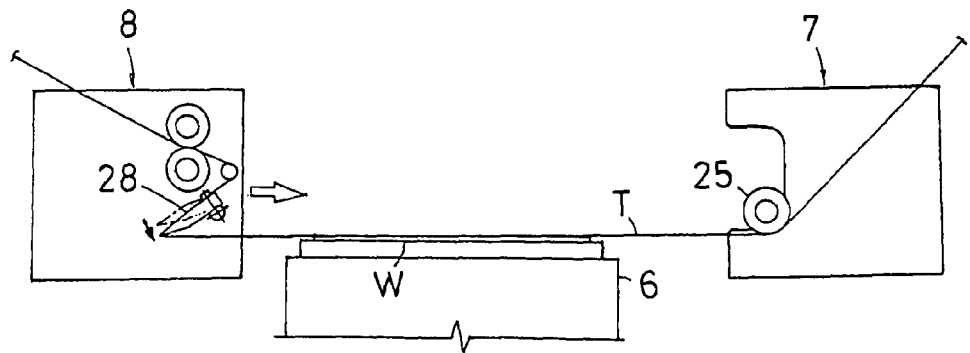

As illustrated in FIG. 13, after the joining of the adhesive tape T, in the tape separation unit 8, the air cylinder 36 protrudes to its stroke end and the guide member 28 moves downward to the lower limit position by the rocking of the operating arm 35.

Figure 14:
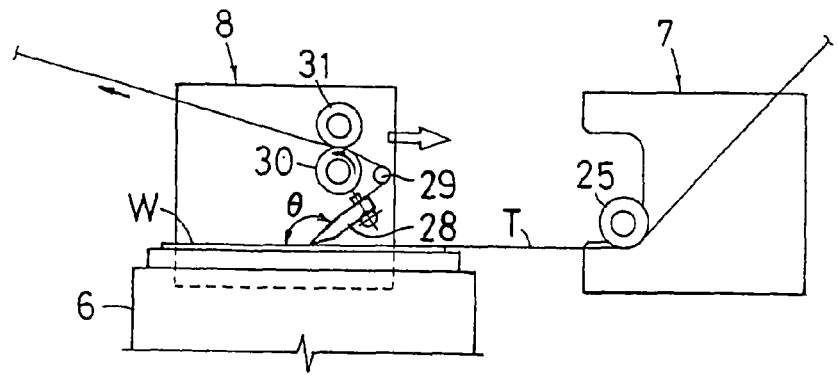
Figure 16:
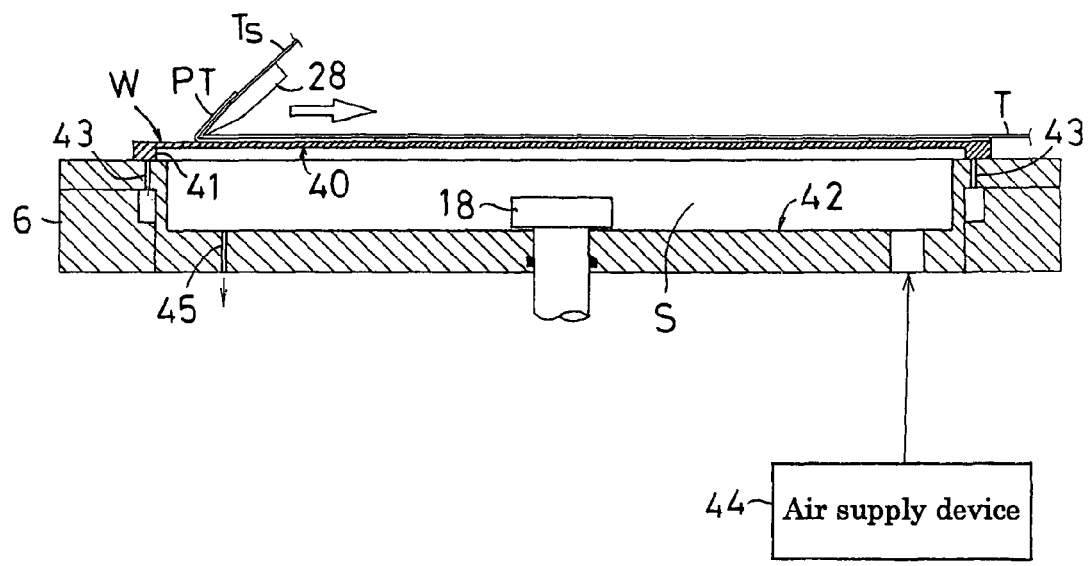
FIG. 16 is a vertical sectional view illustrating the tape separating operation in the first embodiment.
Figure 17:
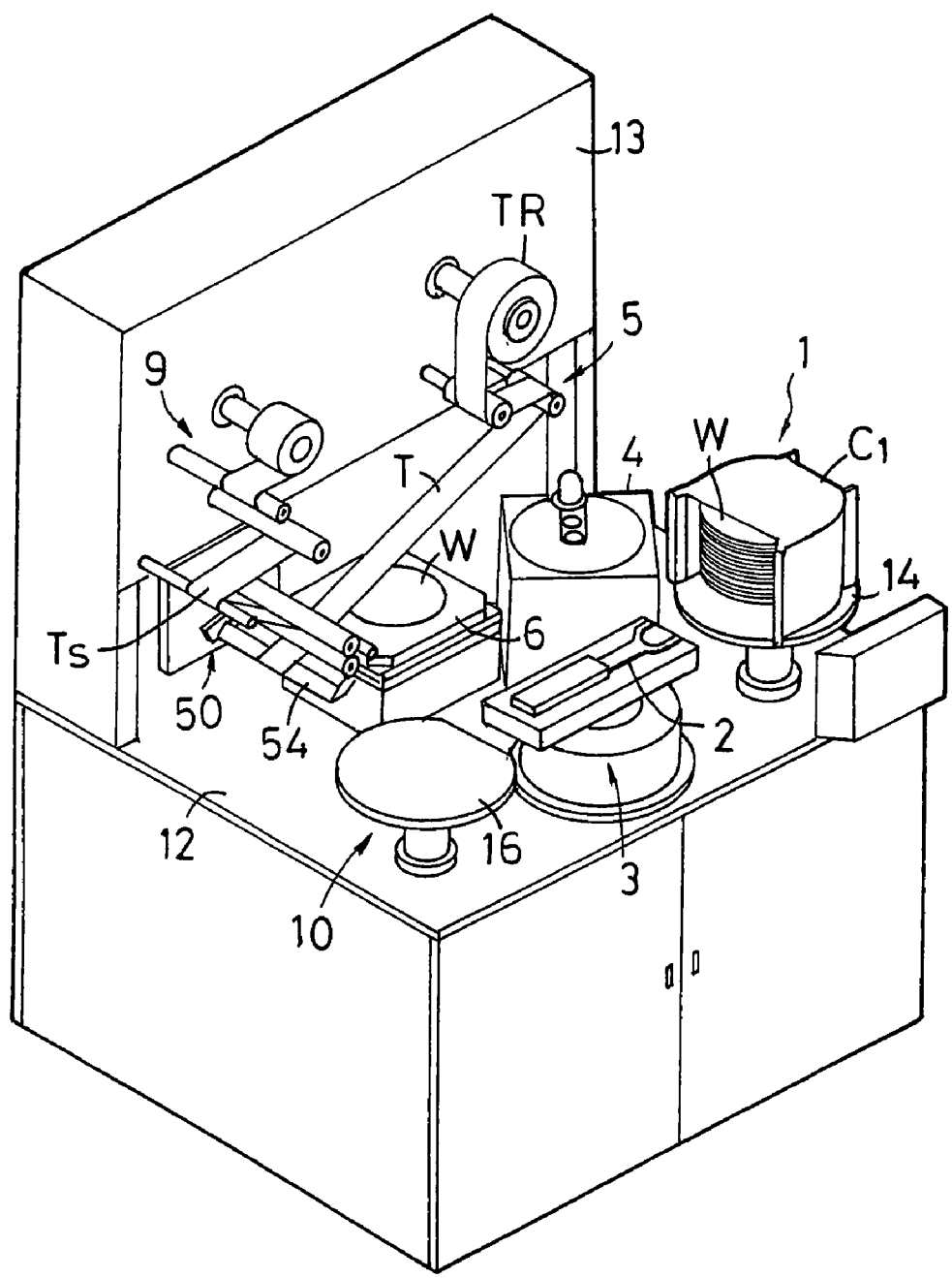
FIG. 17 is a front view illustrating a general configuration of a protective tape separation apparatus according to a second embodiment of the present invention.
Figure 18:
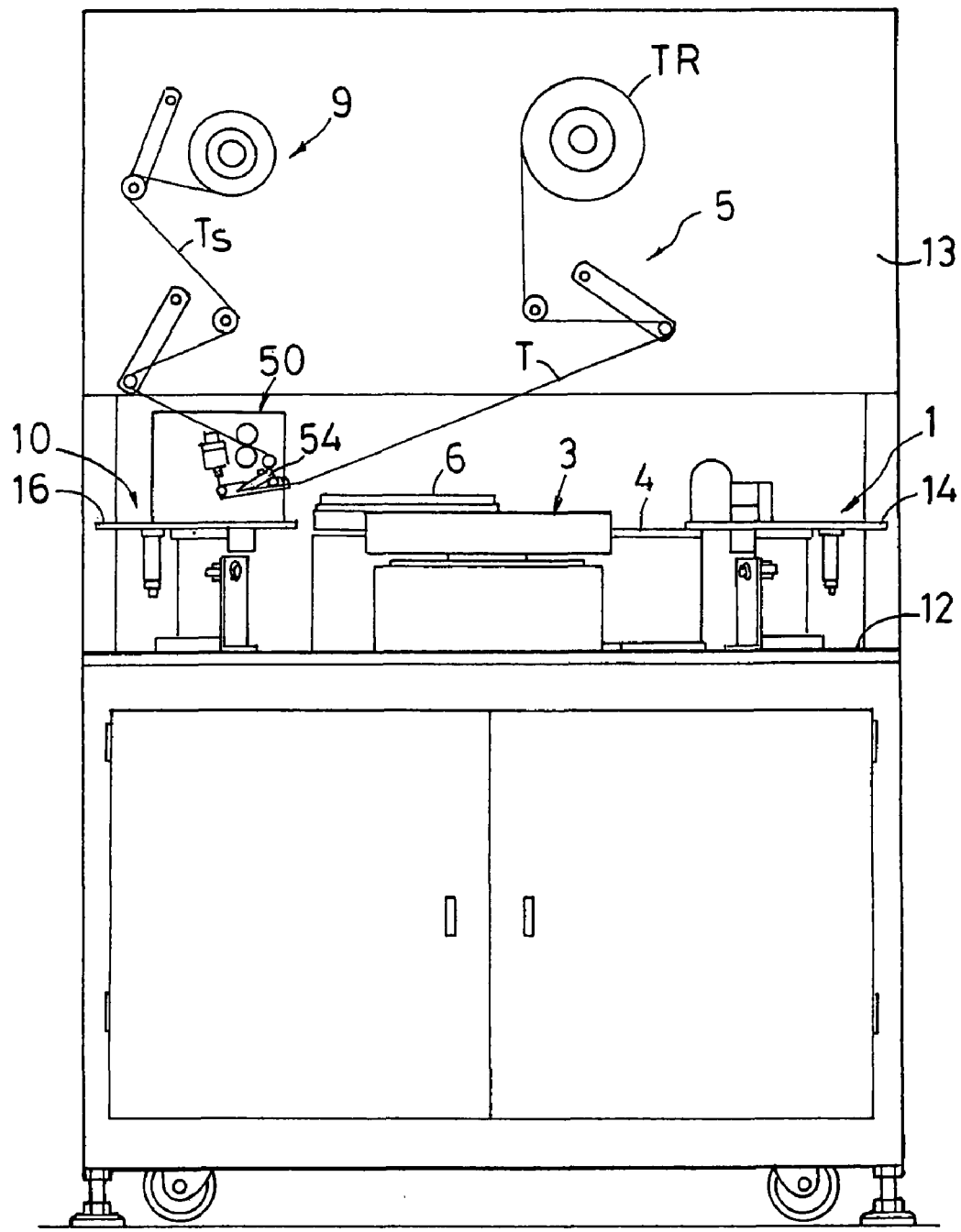
FIG. 18 is a plan view illustrating the general configuration of the protective tape separation apparatus according to the second embodiment.
Figure 19:
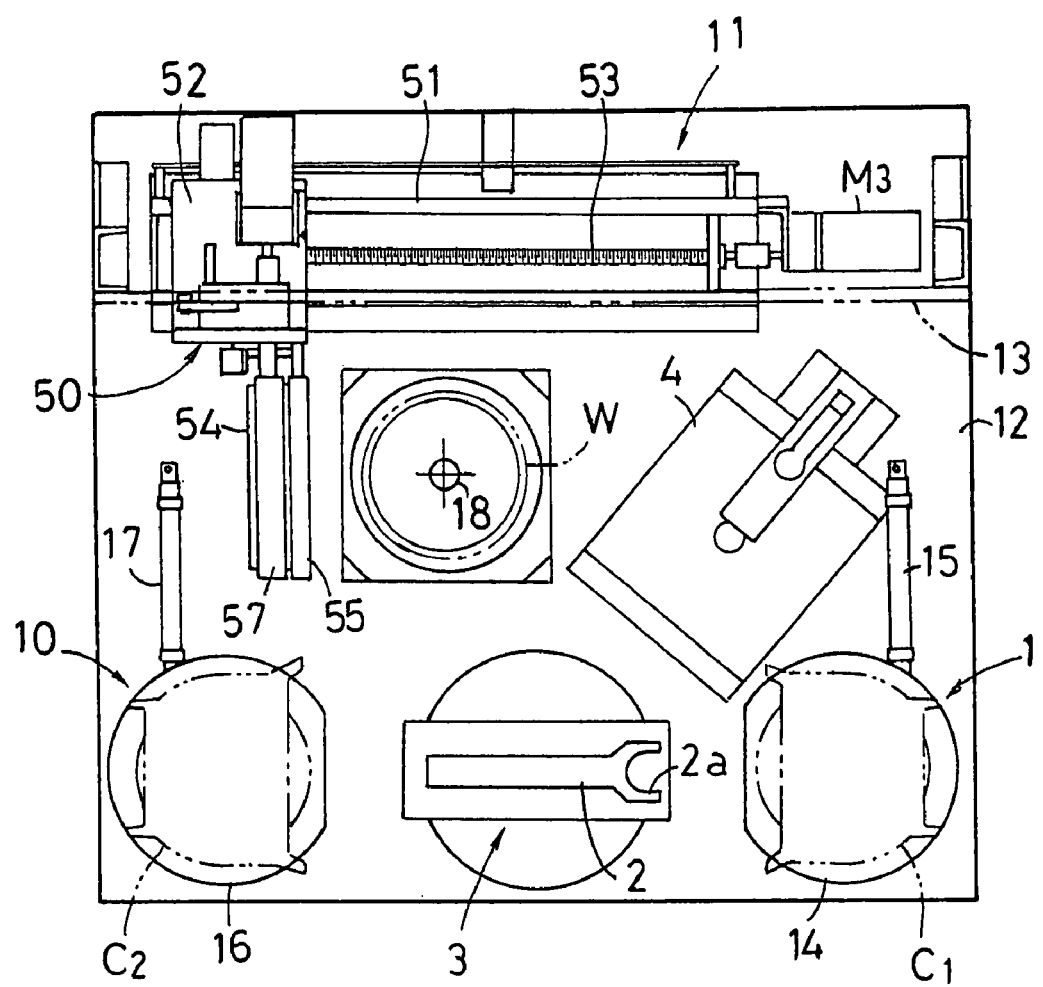
FIG. 19 is a front view illustrating a tape joining/separation unit in the second embodiment.

As illustrated in FIG. 14, next, when the tape separation unit 8 moves forward, the tip end of the guide member 28 moves while pressing the adhesive tape T against the surface of the protective PT and, also, the feed roller 30 feeds the adhesive tape T at a circumferential speed which is in synchronization with the moving speed of the guide member 28. Accordingly, the adhesive tape T is folded by the tip end of the guide member 28 in a reverse direction at a folding angle θ, and then is guided into between the feed roller 30 and the nip roller 31 through the guide roller 29. As illustrated in FIGS. 6 and 16, then, the adhesive tape T travels with the protective tape PT integrated therewith, so that the protective tape PT is separated from the front face of the wafer W.

Desirably, the folding angle θ of the adhesive tape T by the guide member 28 is set at a large angle, for example, 90° or more, preferably 100° or more. Alternatively, the aforementioned operation may be implemented by the folding angle θ of less than 90° (approximate to 90°) depending on conditions such as a viscosity of the adhesive tape T, an elasticity of the adhesive tape T and a strength of the wafer W. Desirably, the folding angle θ of the adhesive tape T is set to be smaller as the elasticity of the adhesive tape T is higher. This setting can be performed in such a manner that an angle of the guide member 28 situated at the lower limit position is adjusted by expansion/contraction of the coupling rod 37. Herein, a change in height of the guide member 28 in response to the change in angle of the guide member 28 can be corrected by adjustment of an attachment position of the guide member 28 to the rotational support shaft 32.

Preferably, a forward moving speed of the guide member 28 is made slow when the guide member 28 passes by the end of the wafer W to start separation of the protective tape PT and, thereafter, such forward moving speed is made fast. When such setting is performed, joining of the adhesive tape T at the annular convex portion 41 corresponding to a separation start end can be performed with certainty, leading to improvement in processability. The feed roller 30 is rotatably driven by a driving device (not illustrated) through a slip clutch which idles by a load exceeding predetermined torque. Therefore, the feed roller 30 feeds the adhesive tape T while applying a predetermined tension to the adhesive tape T.

Figure 15:
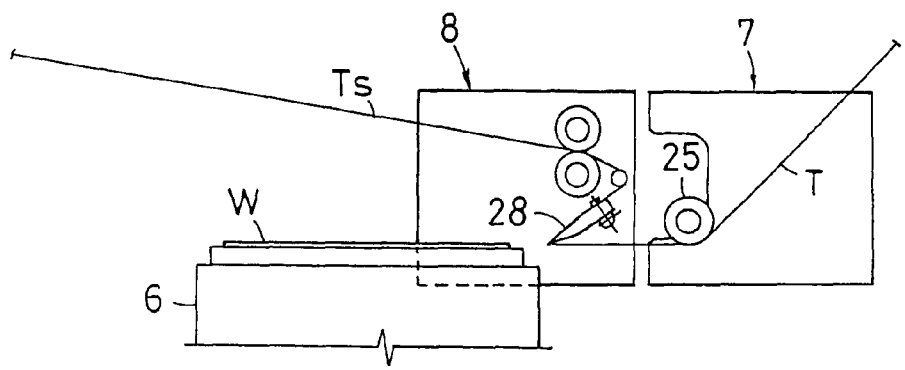

As illustrated in FIG. 15, when the tape separation unit 8 passes above the wafer W and the protective tape PT is completely separated from the front face of the wafer W, the suction pad 18 lifts up the wafer W. Thereafter, the robot arm 2 transports the wafer W from the holding table 6 to the wafer collection section 10. Herein, the wafer W is inserted into and housed in the cassette C2. On the other hand, the tape joining unit 7 and the tape separation unit 8 return to the respective standby positions and, also, the tape collection section 9 reels and collects the adhesive tape Ts subjected to the separating process. In addition, the joining roller 25 and the guide member 28 move upward to standby positions, respectively.

Thus, a series of the separating adhesive tape joining step and the protective tape separating step is completed. Then, the adhesive tape joining/separation apparatus is ready for reception of a subsequent substrate.

FIGS. 17 to 25 illustrate an apparatus according to a second embodiment of the present invention, that is, an apparatus for separating a protective tape from a semiconductor wafer.

In this embodiment, joining of a separating adhesive tape T to a protective tape PT and separation of the protective tape PT from a wafer W are performed simultaneously. However, a basic configuration of the second embodiment is similar to that of the first embodiment. In the second embodiment, therefore, members and portions identical to those in the first embodiment are denoted by symbols identical to those in the first embodiment. Herein, description will be given of a structure different from that in the first embodiment.

Figure 20:
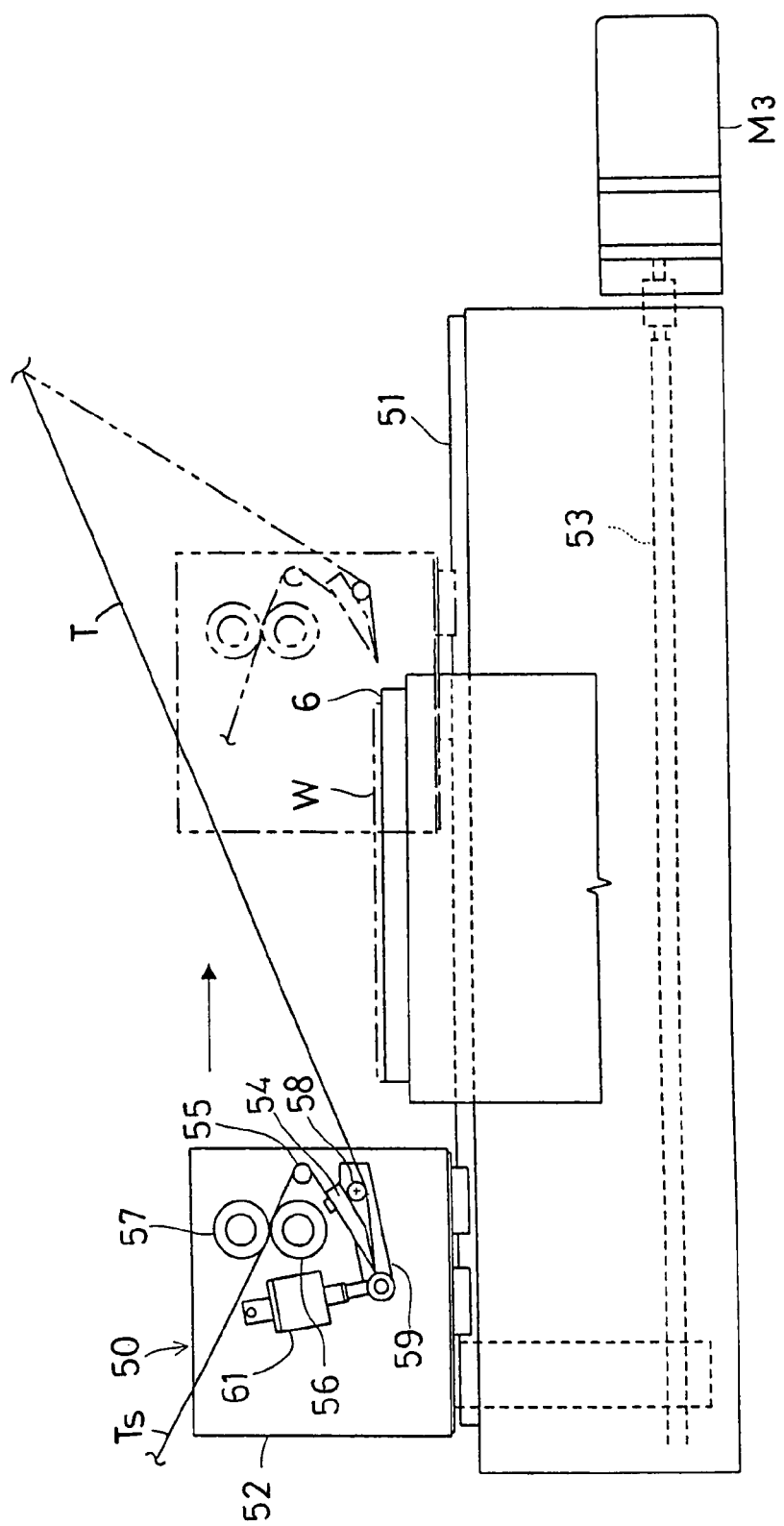
FIGS. 20 to 25 are front views each illustrating a tape separating step in the second embodiment.

As illustrated in FIG. 20, a tape joining/separation unit 50 is provided in place of the tape joining unit 7 and the tape separation unit 8 in the first embodiment. The tape joining/separation unit 50 has the following structure. That is, a movable bench 52 is supported on a pair of front and rear rails 51 so as to slidably move laterally along the pair of rails 51, and is allowed to move laterally and horizontally through a feed screw 53 which is driven by a motor M3 in a forward/backward direction. The movable bench 52 is equipped with a guide member 54 which also serves as a joining member, a guide roller 55, a feed roller 56 which is rotatably driven, and a nip roller 57 which is opposite to the feed roller 56.

The guide member 54 of the tape joining/separation unit 50 is formed into a plate shape. Herein, a tip end of the guide member 54 is formed into a sharp edge, and a width of the guide member 54 is larger than an outer diameter of a wafer W. Moreover, the guide member 54 is fixedly coupled to a rotational support shaft 58 which is rotatably supported at a front side of the movable bench 52 such that a forward/rearward position thereof is adjustable.

Moreover, an operating arm 59 is fastened to and coupled to a base end of the rotational support shaft 58. Further, a free end of the operating arm 59 is coupled to an air cylinder 61 which is attached to the front side of the movable bench 52. The rotational support shaft 58 is rotated by rocking of the operating arm 59 caused by expansion/contraction of the air cylinder 61. With this operation, the tip end of the guide member 54 moves upward/downward.

With reference to FIGS. 21 to 25, next, description will be given of a basic step of separating a protective tape PT joined to a front face of a wafer W. In the second embodiment, operations until a wafer W is held on a holding table 6 are identical to those in the first embodiment. Therefore, description will be given of operations after the wafer W is held on the holding table 6.

Figure 21:
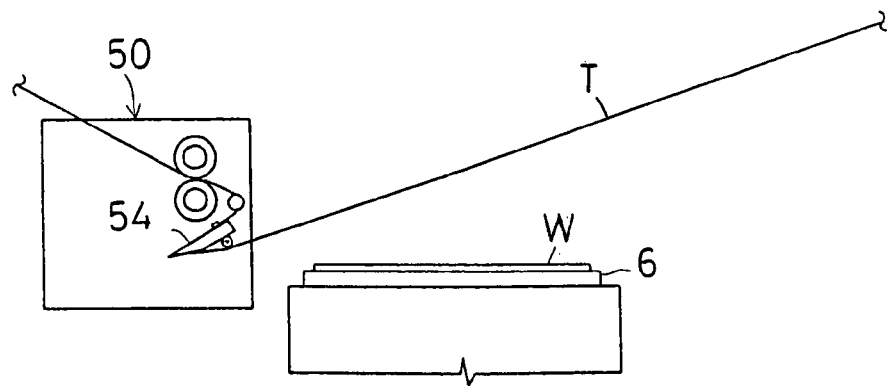
Figure 22:
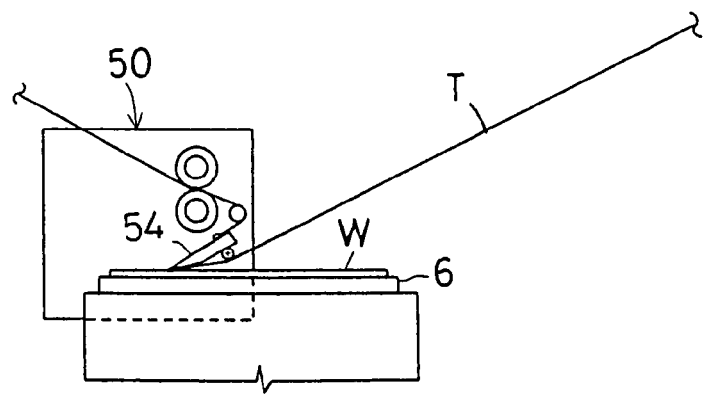

As illustrated in FIG. 21, first, the wafer W is held on the holding table 6, and then a space S defined between the wafer W and the holding table 6 is increased in internal pressure. As illustrated in FIG. 22, next, the tape joining/separation unit 50 moves forward to a position above the wafer W. More specifically, the tape joining/separation unit 50 moves forward such that the tip end of the guide member 54 reaches a forward point spaced away from a circumferential end of the wafer W on a standby position side by an appropriate distance. At this point, the air cylinder 61 protrudes to its stroke end, and the guide member 54 is allowed to move downward to a lower limit position by an operation of the operating arm 59. That is, the tip end of the guide member 54 comes into contact with a surface (non-adhesive surface) of a adhesive tape T, and then presses the adhesive tape T against a surface of a protective tape PT.

Figure 23:
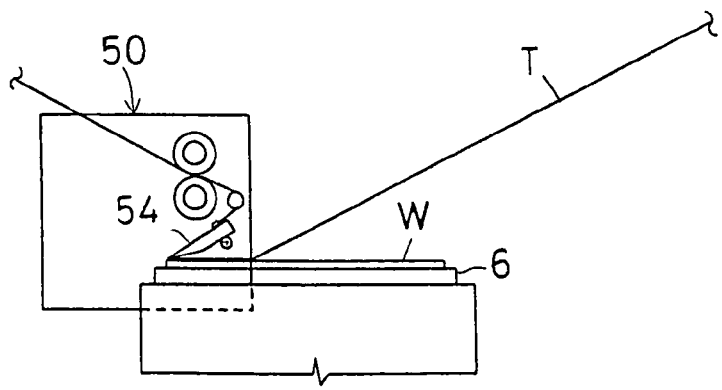

As illustrated in FIG. 23, when the guide member 54 moves downward, the tape joining/separation unit 50 moves rearward to its standby position. That is, the tip end of the guide member 54 joins the adhesive tape T to the surface of the protective tape PT while pressing the adhesive tape T against the protective tape PT.

Figure 24:
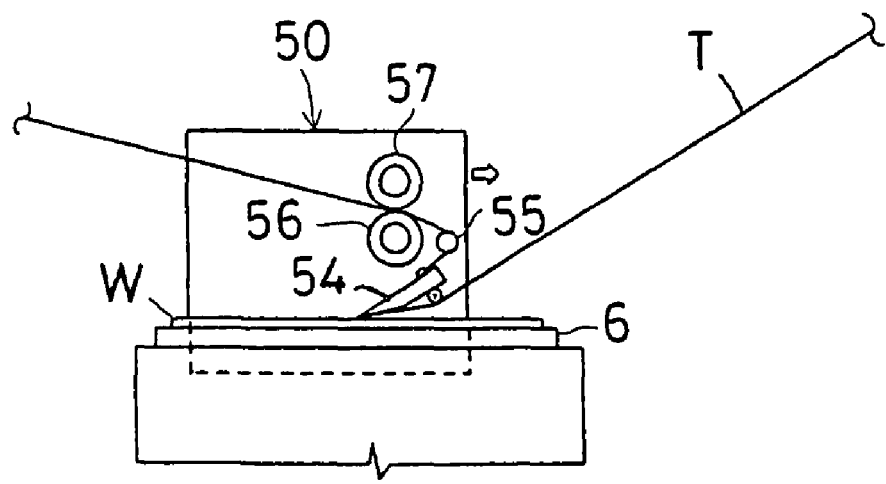

As illustrated in FIG. 24, when the tip end of the guide member 54 reaches the circumferential end of the wafer W, the tape joining/separation unit 50 moves forward in a reverse direction. Herein, the tip end of the guide member 54 moves while pressing the adhesive tape T against the surface of the protective tape PT, and the feed roller 56 reels the adhesive tape T at a circumferential speed which is in synchronization with the moving speed of the guide member 54. As described above, when the joining of the adhesive tape T and the separation of the adhesive tape T are performed simultaneously, the protective tape PT joined to and integrated with the adhesive tape T is separated from the front face of the wafer W together with the adhesive tape T.

Figure 25:
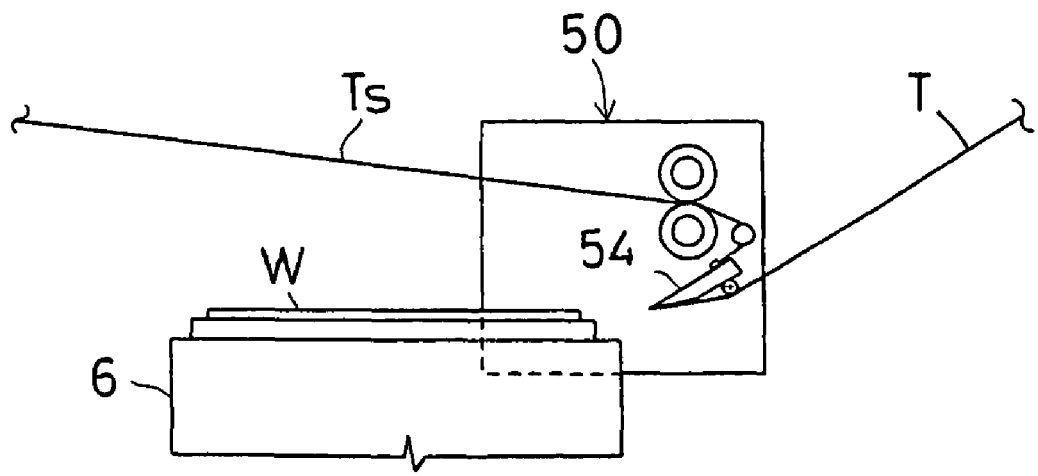

As illustrated in FIG. 25, when the tape joining/separation unit 50 passes by the wafer W and the protective tape PT is completely separated from the front face of the wafer W, a robot arm 2 transports the wafer W from the holding table 6 to a wafer collection section 10. Herein, the wafer W is inserted into and housed in a cassette C2. On the other hand, the tape joining/separation unit 50 returns to its standby position and, also, a tape collection section 9 reels and collects the adhesive tape Ts subjected to the separating process. In addition, the guide member 54 moves upward to its standby position.

Thus, a series of the protective tape separating steps is completed. Then, the adhesive tape joining/separation apparatus is ready for reception of a subsequent wafer.

The apparatus according to each of the aforementioned embodiments produces the following advantages. That is, even in a case of using a wafer W with surface irregularities, which has an annular convex portion 41 formed along an outer periphery of a back face so as to surround a back-ground area, it is possible to join a separating adhesive tape T to a protective tape PT joined to a front face of the wafer W, with good accuracy. That is, upon joining of the adhesive tape T to the wafer W, a space S defined inside the wafer W is pressurized appropriately with air supplied thereinto. Accordingly, even when the separating adhesive tape T is pressed by the joining roller 25 serving as a joining member or even when the separating adhesive tape T is pressed by the guide member 28 or 54 serving as a joining member, a joining force is prevented from being weakened due to disadvantageous deformation of the wafer W by the joining force. As a result, it is possible to join the adhesive tape T to the surface of the protective tape PT with good accuracy such that the adhesive tape T comes into close contact with the protective tape PT. Further, it is possible to separate the protective tape PT from the front face of the wafer W with good accuracy by the separation of the adhesive tape T joined to the protective tape PT.

The present invention may be modified variously as follows.

(1) In each of the aforementioned embodiments, the guide member 28 or 54 for guiding the separating adhesive tape T in the reverse direction may be a roller with a small diameter.

(2) In each of the aforementioned embodiments, the internal pressure in the space S may be adjusted in such a manner that the fine hole 45 for outflow of air is formed on a plug detachably attached to the holding table 6 and there are prepared plugs having fine holes 45 with different diameters for exchange.

(3) In each of the aforementioned embodiments, a low-pressure relief valve is attached so as to be communicated with the recess 42, thereby achieving an outflow of internal air; thus, the internal pressure in the space S may be maintained. Herein, a change from the relief valve to a variable relief valve capable of adjusting an operating pressure makes it possible to finely adjust the internal pressure in the space S.

(4) In each of the aforementioned embodiments, a size of the recess 42 formed on the holding table 6 may be made smaller than a diameter of a flat convex portion 40 formed by grinding of a back face of a wafer W of a minimum size. Further, plural sets of vacuum suction holes 43 may be formed concentrically along the outer periphery of the recess 42 to suction hold annular convex portions 41 of wafers W of different sizes.

(5) In each of the aforementioned embodiments, only when the wafer W is placed on the flat top side of the holding table 6, the space S is defined between the back face of the wafer W and the holding table 6 by the flat concave portion 40 formed by grinding. For example, even when the recess 42 is not formed on the holding table 6, the internal pressure in the space S defined by the flat concave portion 40 can be increased by air supplied from air supply holes formed on the top side of the holding table 6.

(6) In each of the aforementioned embodiments, air is supplied into the space S defined by the flat convex portion 40; however, such fluid is not limited to air as long as a wafer W is prevented from being degraded in quality. The fluid may be either gas or liquid.

(7) In each of the aforementioned embodiments, upon joining of the adhesive tape T, a force that the joining roller 25 presses the annular convex portion 41 serving as a joining start end is larger than a force that the joining roller 25 presses the flat concave portion 40. With this configuration, it is possible to bring the adhesive tape T into close contact with the protective tape PT with certainty.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for joining a separating adhesive tape to a protective tape joined to a front face of a semiconductor wafer, the method comprising the steps of:
    suction-holding a semiconductor wafer against a holding table by an annular convex portion, said annular convex portion being formed along an outer periphery of a back face of the semiconductor wafer so as to surround a back-ground area, such that the holding table is brought into close contact with the entire annular convex portion;
    supplying fluid from a side of the holding table into a space defined between the back face of the semiconductor wafer and the holding table, for increasing an internal pressure in the space;
    supplying the separating adhesive tape toward a surface of the protective tape joined to the semiconductor wafer; and
    moving a joining member, which has a width larger than an outer diameter of the semiconductor wafer, from a first end to a second end of the semiconductor wafer such that the joining member presses the adhesive tape against the surface of the protective tape, for joining the adhesive tape to the surface of the protective tape.

2. The method of claim 1, wherein
    the holding table includes a recess communicated with a flat concave portion formed on the back face of the semiconductor wafer by grinding, and the annular convex portion of the semiconductor wafer is suction held by an outer periphery of the recess.

3. The method of claim 1, wherein
    the fluid is supplied into the space while an outflow of the fluid from the space is permitted, so that a pressure in the space is increased.

4. The method of claim 1, wherein
    the joining member moves slower at the annular convex portion corresponding to an adhesive tape joining start position than the adhesive tape joining portion where the adhesive tape is to be joined from the adhesive tape joining start position.

5. The method of claim 4, wherein
    a pressing force of the joining member to be applied to the annular convex portion corresponding to the adhesive tape joining start position is larger than a pressing force of the joining member to be applied to the flat concave portion formed inside the annular convex portion.

6. The method of claim 3, wherein
    the holding table includes a fine hole for permitting the outflow of the fluid.

7. The method of claim 3, wherein
    the holding table includes a discharge hole provided with a relief valve which adjusts an operating pressure, and the relief valve permits the outflow of the fluid.

8. A method for separating from a semiconductor wafer a protective tape joined to a front face of the semiconductor wafer, the method comprising the steps of:
    suction-holding a semiconductor wafer against a holding table by an annular convex portion, said annular convex portion being formed along an outer periphery of a back face of the semiconductor wafer so as to surround a back-ground area, such that the holding table is brought into close contact with the entire annular convex portion;
    supplying fluid from a side of the holding table into a space defined between the back face of the semiconductor wafer and the holding table, for increasing an internal pressure in the space;
    supplying a separating adhesive tape toward a surface of the protective tape joined to the semiconductor wafer;
    moving a joining member, which has a width larger than an outer diameter of the semiconductor wafer, from a first end to a second end of the semiconductor wafer such that the joining member presses the adhesive tape against the surface of the protective tape, for joining the adhesive tape to the surface of the protective tape; and
    guiding the joined separating adhesive tape in a reverse direction with a guide member, which moves from the first end to the second end of the semiconductor wafer, to separate the protective tape integrated with the adhesive tape from the front face of the semiconductor wafer.

9. The method of claim 8, wherein
    the guide member is used as the joining member so that the joining of the adhesive tape to the protective tape and the separation of the protective tape from the semiconductor wafer are performed simultaneously.

10. The method of claim 8, wherein
    the guide member is made of a plate material having an edge.

11. The method of claim 8, wherein
    the joining member moves slower at the annular convex portion corresponding to an adhesive tape joining start position than the adhesive tape joining portion where the adhesive tape is to be joined from the adhesive tape joining start position.

12. The method of claim 11, wherein
    a pressing force of the joining member to be applied to the annular convex portion corresponding to the adhesive tape joining start position is larger than a pressing force of the joining member to be applied to the flat concave portion formed inside the annular convex portion.

13. The method of claim 8, wherein
    the holding table includes a fine hole for permitting the outflow of the fluid.

14. The method of claim 8, wherein
    the holding table includes a discharge hole provided with a relief valve which adjusts an operating pressure, and the relief valve permits the outflow of the fluid.

* * * * *